United States Patent [19]

Ishibashi et al.

[11] Patent Number: 5,567,960
[45] Date of Patent: Oct. 22, 1996

[54] II/VI-COMPOUND SEMICONDUCTOR LIGHT EMITTING DEVICE

[75] Inventors: Akira Ishibashi; Satoshi Ito; Hiroyuki Okuyama, all of Kanagawa; Kazushi Nakano, Tokyo; Kenji Kondo, Kanagawa; Reiko Takeishi, Tokyo, all of Japan

[73] Assignee: Sony Corporation, Tokyo, Japan

[21] Appl. No.: 429,850

[22] Filed: Apr. 27, 1995

[30]     Foreign Application Priority Data

Apr. 28, 1994  [JP]  Japan ................................ 6-092552
Nov. 9, 1994   [JP]  Japan ................................ 6-275285

[51] Int. Cl.⁶ .......................... H01L 33/00; H01S 3/19
[52] U.S. Cl. ..................... 257/103; 257/101; 257/102; 372/45; 372/46
[58] Field of Search ..................... 372/45, 44; 257/101, 257/103, 79, 102, 94

[56]              References Cited

U.S. PATENT DOCUMENTS

| | | | |
|---|---|---|---|
| 5,268,918 | 12/1993 | Akimoto et al. | 372/45 |
| 5,291,507 | 3/1994  | Haase et al.   | 372/44 |
| 5,371,756 | 12/1994 | Fujii          | 372/45 |
| 5,373,521 | 12/1994 | Takahashi      | 372/45 |
| 5,394,422 | 2/1995  | Fitzpatrick    | 372/45 |
| 5,420,446 | 5/1995  | Narui et al.   | 257/103 |
| 5,471,067 | 11/1995 | Ikeda et al.   | 275/14 |

FOREIGN PATENT DOCUMENTS

| | | |
|---|---|---|
| 0556461A2 | 8/1993 | European Pat. Off. . |
| 0605051A1 | 6/1994 | European Pat. Off. . |
| 2226698   | 4/1990 | United Kingdom . |

OTHER PUBLICATIONS

Structural characterization of II–VI Separate Confinement Heterostructure lasers etc.–931 Journal of Applied Physics 75 (1994 1 Jan., No. 1 pp. 63–67.

Electronics Letters 31st Mar. 1994 vol. 30, No. 7—Nakayama et al pp. 568–570.

320 Applied Physics Letters 62(1993) 17 May, No. 20, New York—Gaines et al pp. 2462–2464.

Electronics Letters 3rd Mar. 1994 vol. 30 No. 5 Room temperature pulsed operation of blue laser diodes—Okuyama et al, pp. 415–416.

Electronics Letters 29th Apr. 1993 vol. 29, No. 9—Itoh et al pp. 766–768.

Primary Examiner—James W. Davie
Attorney, Agent, or Firm—Hill, Steadman & Simpson

[57]             ABSTRACT

A lifetime of a II/VI-compound semiconductor light emitting device can be extended. The II/VI-compound semiconductor light emitting device includes an active layer (4) and a p-side cladding layer (6). An active-layer side portion (26) of the p-side cladding layer (6) is formed as a lightly impurity-doped region or a non-doped region.

14 Claims, 14 Drawing Sheets

II/VI-COMPOUND SEMICONDUCTOR LIGHT EMITTING DEVICE

BACKGROUND OF THE INVENTION

The present invention relates to a II/VI-compound semiconductor light emitting device for use in light emitting devices, such as a light emitting diode and a semiconductor laser and, particularly to a green or blue semiconductor light emitting device.

In a magneto-optical recording for recording or reproducing or recording and reproducing a magneto-optical signal by laser beams, a demand for using a short-wavelength laser, e.g., a blue semiconductor laser as a laser light source is progressively increased in order to improve a recording density. A II-VI ZnMgSSe semiconductor laser receives a remarkable attention as this kind of semiconductor laser.

It is generally difficult to dope a p-type impurity in a II/VI-compound semiconductor, such as ZnSe, ZnSSe and ZnMgSSe. The doping of p-type impurity could be finally realized by using nitrogen N. When N is doped in ZnSe, an upper limit value of a hole concentration is $1\times10^{18} cm^{-3}$. When N is doped in ZnSSe, it is up to $10^{17} cm^{-3}$ which is a considerably low value. Since it is confirmed that nitrogen N itself is introduced into a crystal, it is considered that nitrogen N which does not increase hole density is inactivated. Therefore, it is considered that most of such nitrogen N become interlattice atoms.

As shown in FIG. 1 of the accompanying drawings, the ZnMgSSe semiconductor laser made of the II/VI-compound semiconductor has a II/VI-compound semiconductor laser portion 7. The II/VI-compound semiconductor laser portion 7 has an n-GaAs substrate 1, a first cladding layer 2 made of n-ZnMgSSe, a first guide layer 3 made of n-ZNSE with or without S (hereinafter referred to as "ZN(S)Se"), an active layer 4 made of ZnCdSe, a second guide layer 5 made of p-Zn(S)Se, a second cladding layer 6 made of p-ZnMgSSe and an electrode 14 made of In, for example. The first cladding layer 2, the first guide layer 3, the active layer 4, the second guide layer 5 and the second cladding layer 6 are formed on the major surface of the n-GaAs substrate 1, in that order. The electrode 14 is formed on the other surface of the substrate 1 in ohmic contact. The ZnMgSSe semiconductor laser has a p-side electrode portion 12 formed on the II/VI-compound semiconductor laser portion 7. The p-side electrode portion 12 has a first semiconductor layer 8 made of p-Zn(S)Se as a capping layer, a second semiconductor layer 9 having a multiple quantum well (MQW) structure of ZnSE and ZnTe, a third semiconductor layer 10 made of p-ZnTe, an insulating layer 13 made of polyimide, for example, and a p-type metal electrode 11 having a multilayer structure in which Pd, Pt and Au are sequentially deposited. The first semiconductor layer 8, the second semiconductor layer 9, the third semiconductor layer 10 are sequentially formed by epitaxial growth. Then, the second and third semiconductor layers 9, 10 are selectively etched such that their center portions are left in a stripe fashion. The insulating layer 13 is buried in both side portions where the second and third semiconductor layers 9, 10 are removed by etching. The metal electrode 11 is formed on the third semiconductor 10 in ohmic contact.

Although the II/VI-compound semiconductor laser of this kind achieves continuous wave oscillation at room temperature, the II/VI-compound semiconductor laser can continuously oscillate in the order of seconds and is considerably short lifetime. Therefore, the II/VI-compound semiconductor laser could not be applied to an optical pickup device for high-density magneto-optical recording in actual practice.

SUMMARY OF THE INVENTION

In view of the aforesaid aspect, it is an object of the present invention to provide a long-life II/VI-compound semiconductor light emitting device.

The same assignee of this application had found the following fact. As a doping concentration of a p-type impurity, e.g., nitrogen N is increased in a p-side region adjacent to an active layer, particularly in a cladding layer in order to reduce a resistivity, nitrogen (hereinafter referred to as interstitial nitrogen $N_{int}$) located between lattices is increased. The interstitial nitrogen $N_{int}$ becomes a point defect in a crystal or induces another point defect, thereby contributing to the increase of dislocation. As a result, concentration of the interstitial nitrogen $N_{int}$ brings a harmful influence on lifetime of the II/VI-compound semiconductor light emitting device. The same assignee of this application obtained a long-life II/VI-compound semiconductor light emitting device by suppressing the p-type-impurity doping concentration.

According to a first aspect of the present invention, a II/VI-compound semiconductor light emitting device includes an active layer and a p-side cladding layer. An active-layer side portion of the p-side cladding layer is a lightly impurity-doped region or a non-doped region.

According to a second aspect of the present invention, in the II/VI-compound semiconductor light emitting device according to the first aspect of the present invention, the lightly impurity-doped region or non-doped region is provided at a portion in contact with the active layer.

According to a third aspect of the present invention, in the II/VI-compound semiconductor light emitting device according to the first aspect of the present invention, the lightly impurity-doped region or non-doped region is provided at a portion in contact with the p-side guide layer.

According to a fourth aspect of the present invention, in the II/VI-compound semiconductor light emitting device according to the third aspect of the present invention, the lightly impurity-doped region is provided in the p-side guide layer.

According to a fifth aspect of the present invention, in the II/VI-compound semiconductor light emitting device according to the fourth aspect of the present invention, a portion, which is in contact with the active layer, of the p-side guide layer is a non-doped region.

According to a sixth aspect of the present invention, in the II/VI-compound semiconductor light emitting device according to the fourth aspect of the present invention, an impurity doping concentration of the lightly impurity-doped region of the p-side cladding layer is small as compared with that of the lightly impurity-doped region of the second guide layer.

According to a seventh aspect of the present invention, in the II/VI-compound semiconductor light emitting device according to the first aspect of the present invention, an impurity doping concentration of the p-side cladding layer is progressively decreased toward the active layer.

According to an eighth aspect of the present invention, the II/VI-compound semiconductor light emitting device includes the active layer and the p-side guide layer. An active-layer side portion of the p-side guide layer is a lightly impurity-doped region or a non-doped region.

According to a ninth aspect of the present invention, in the II/VI-compound semiconductor light emitting device according to the first aspect of the present invention, the lightly impurity-doped region has an interstitial impurity concentration of $2\times10^{17} cm^{-3}$ or smaller.

According to a tenth aspect of the present invention, in the II/VI-compound semiconductor light emitting device according to the first aspect of the present invention, when the lightly impurity-doped region is made of ZnMgSSe, an impurity doping concentration of the lightly impurity-doped region is $7\times10^{17} cm^{-3}$ or smaller.

According to an eleventh aspect of the present invention, in the II/VI-compound semiconductor light emitting device according to the tenth aspect of the present invention, when the lightly impurity-doped region is made of ZnMgSSe with a band gap energy of 2.9 eV or larger, an impurity doping concentration of the lightly impurity-doped region is $3\times10^{17} cm^{-3}$ or smaller.

According to a twelfth aspect of the present invention, in the II/VI-compound semiconductor light emitting device according to the first aspect of the present invention, when the lightly impurity-doped region is made of Zn (S) Se, an impurity doping concentration of the lightly impurity-doped region is $8\times10^{17} cm^{-3}$ or smaller.

According to a thirteenth aspect of the present invention, the II/VI-compound semiconductor light emitting device includes the active layer and the p-side guide layer. A portion, which is in contact with the active layer, of the p-side cladding layer is a non-doped region and a region thereof other than the non-doped region is a doped region.

According to a fourteenth aspect of the present invention, in the II/VI-compound semiconductor light emitting device according to the thirteenth aspect of the present invention, an active-layer side portion of the guide layer is a non-doped region.

DESCRIPTION OF THE PREFERRED EMBODIMENTS

Embodiments of the present invention will hereinafter be described with reference to the drawings.

In the following embodiments, the present invention is applied to a II/VI-compound semiconductor laser.

Figure 1:
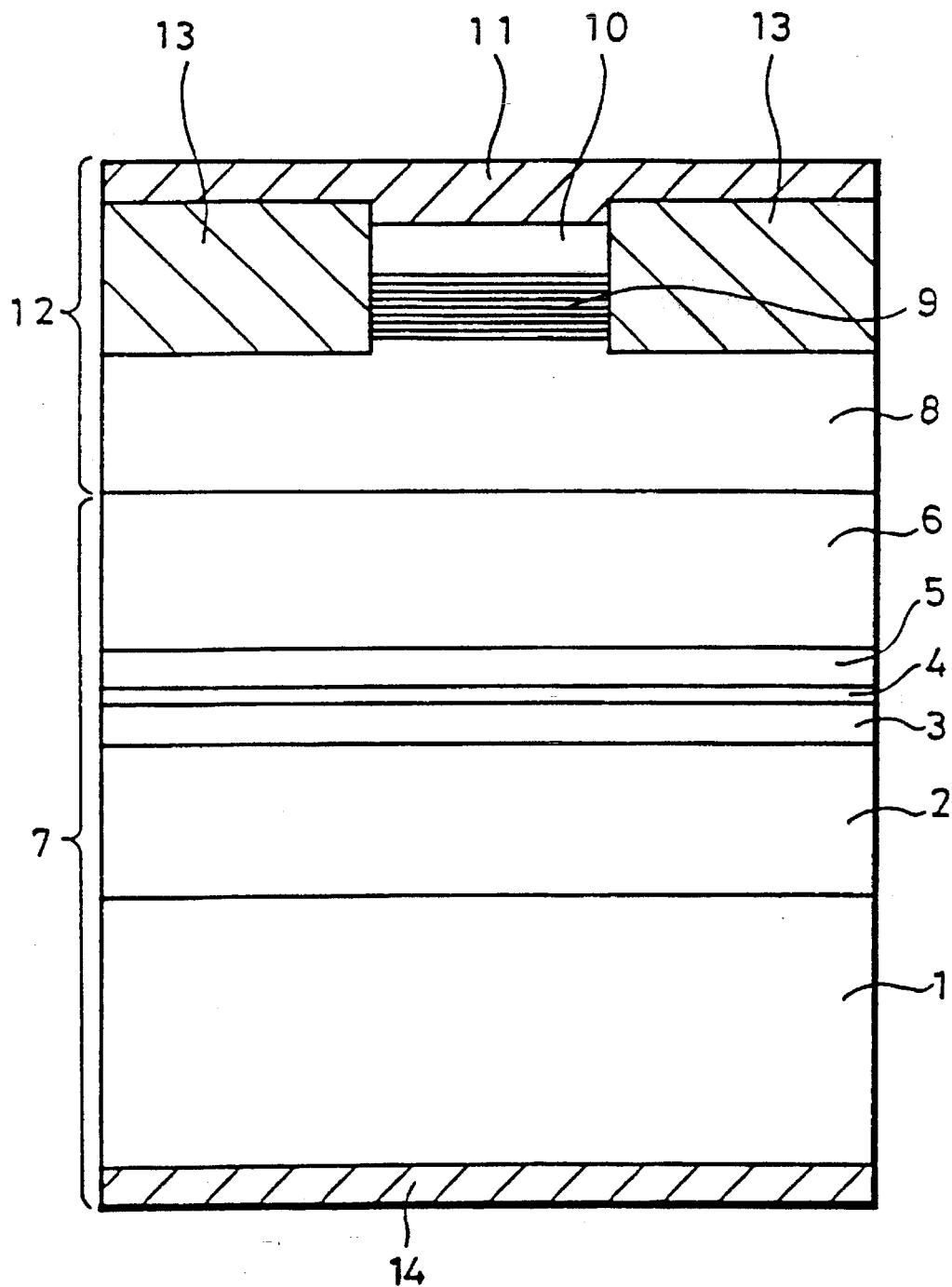
FIG. 1 is a diagram showing an arrangement of a III/VI-compound semiconductor laser.
Figure 2:
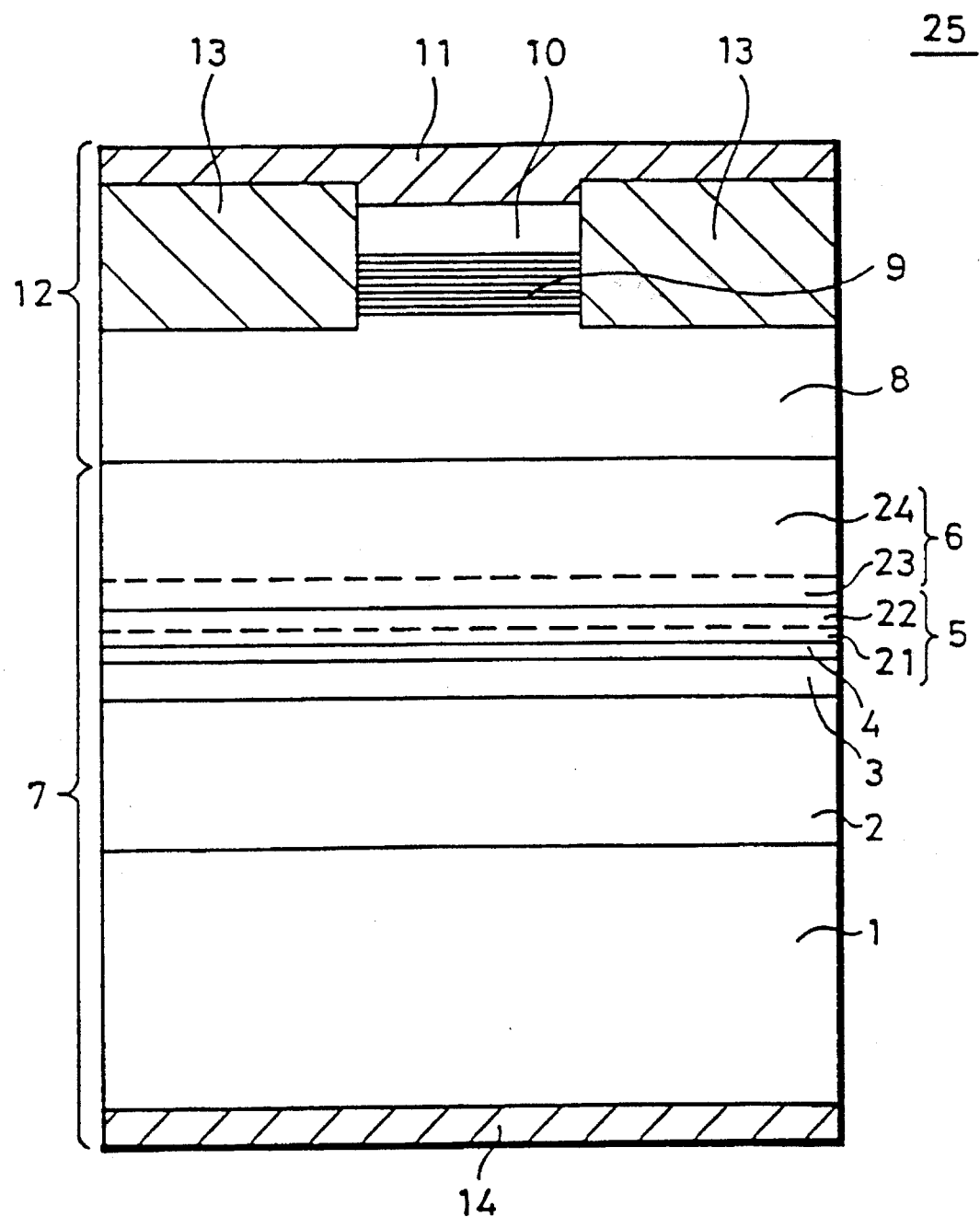
FIG. 2 is a diagram showing an arrangement of a II/VI-compound semiconductor light emitting device according to a first embodiment of the present invention.

FIG. 2 shows a first embodiment according to the present invention.

As shown in FIG. 2, a II/VI-compound semiconductor laser 25 has a substrate 1 made of n-GaAs single crystal doped with Si, for example, a first cladding layer 2 made of n-ZnMgSSe doped with Cl with a thickness of 0.8 µm, for example, a first guide layer 3 made of n-Zn(S)Se doped with Cl with a thickness of 120 nm, for example, an active layer 4 made of ZnCdSe with a thickness of 7 nm, for example, a second guide layer 5 made of Zn(S)Se with a thickness of 120 nm, for example, and a second cladding layer 6 made of p-ZnMgSSe doped with nitrogen N with a thickness of 0.6 µm, for example. The first cladding layer 2, the first guide layer 3, the active layer 4, the second guide layer 5 and the second cladding layer 6 are sequentially formed on the major surface of the substrate 1 by epitaxial growth to form a semiconductor laser portion 7.

In the first embodiment, nitrogen doping concentration in a p-side region from the second cladding layer 6 to the second guide layer 5 is reduced gradually toward the active layer 4 to present a multistage doping concentration distribution of nitrogen N which is a p-type impurity.

Specifically, as shown in FIG. 2, the second guide layer 5 has a non-doped region 21 made of Zn(S)Se formed at its portion in contact with the active layer 4 and a lightly impurity-doped region 22 made of p-Zn(S)Se, which will be described later on, formed on the second cladding layer 5 side thereof. The second cladding layer 6 has a lightly impurity-doped region 23, which will be described later on, formed at its portion in contact with the second guide layer 5 and a heavily impurity-doped region 24 formed at the rest portion.

At least the second cladding layer 6 has the multistage doping concentration distribution of p-type impurity having two stages or more.

Subsequently, the II/VI-compound semiconductor laser 25 has a p-side electrode portion 12 formed on the semiconductor laser portion 7. The p-side electrode portion 12 has a first semiconductor layer 8 serving as a capping layer made of n-Zn(S)Se doped with N, for example, with a thickness of 0.6 µm, for example, a second semiconductor layer 9 having a multiple quantum well (MQW) structure of ZnSe and ZnTe, a third semiconductor layer 10 made of n-ZnTe doped with N, an insulating layer, e.g., polyimide layer 13 and a metal electrode 11 having a multilayer structure in which Pd, Pt and Au are sequentially laminated. The first semiconductor layer 8, the second semiconductor layer 9 and the third semiconductor layer 10 are continuously formed on the second cladding layer 6 by epitaxial growth. The second and third semiconductor layers 9, 10 are selectively removed by etching such that their center portions are left in a stripe fashion. The polyimide layer 13 is buried in both side portions where the second and third semiconductor layers 9, 10 are removed by etching. The metal electrode 11 is formed on the striped third semiconductor layer 10 so as to have ohmic contact to the latter. The semiconductor laser portion 7 has the other electrode 14 made of In formed on the other surface of the substrate 1 so as to have ohmic contact to the substrate 1.

Figure 3:
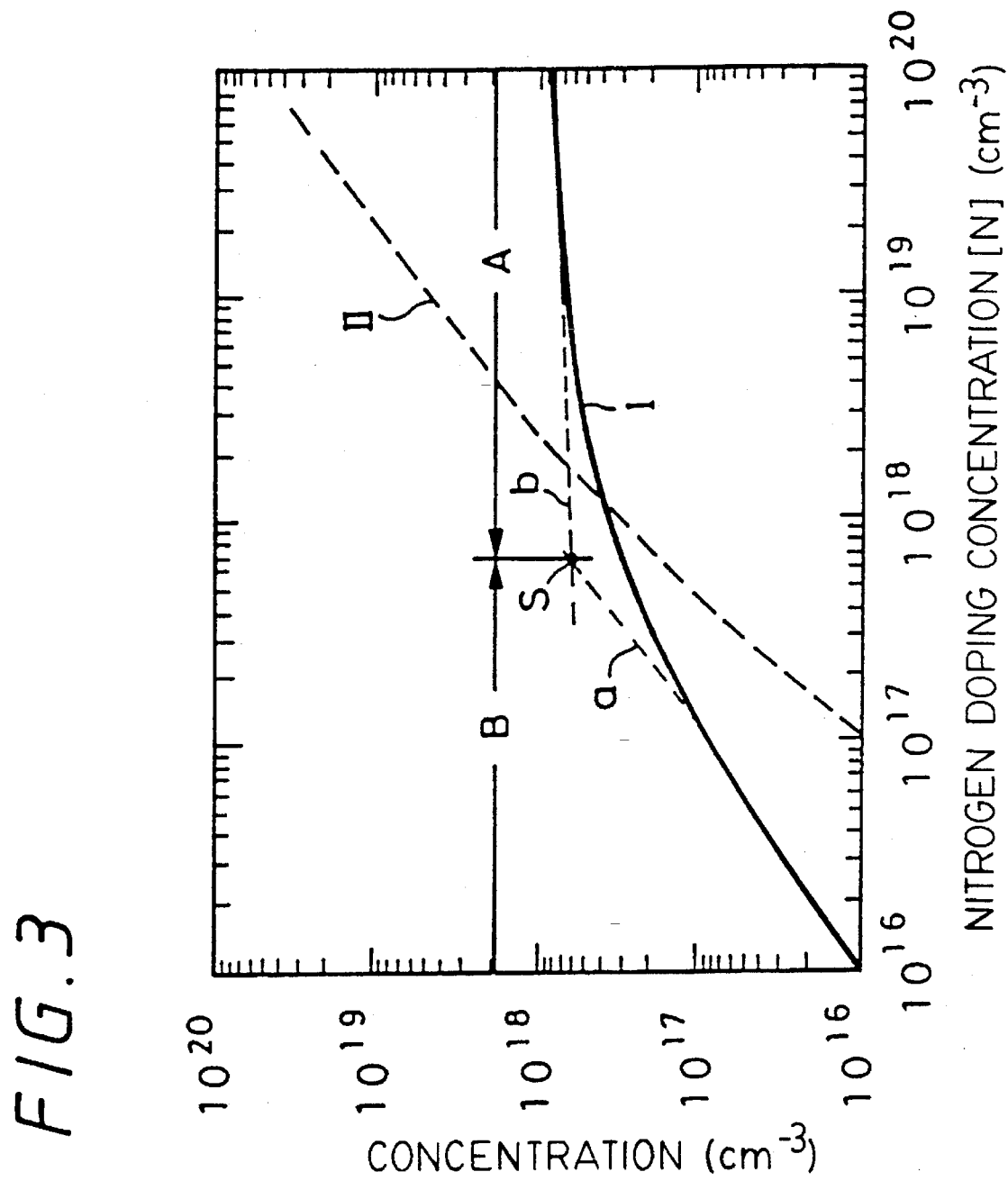
FIG. 3 is a graph showing an acceptor concentration and an interstitial nitrogen concentration relative to a nitrogen doping concentration measured when nitrogen is doped in ZnMgSSe with a band gap energy of 2.74 eV at room temperature.

FIG. 3 shows an activated acceptor concentration (NA-ND) and concentration of an interstitial nitrogen $N_{int}$ relative to nitrogen doping concentration measured when nitrogen, a p-type impurity, was doped in ZnMgSSe (with a band gap energy of 2.74 eV at room temperature) forming the cladding layers 2, 6. In FIG. 3, a solid curve I represents the acceptor concentration and a broken curve II represents the interstitial nitrogen concentration.

The acceptor concentration starts being saturated from the nitrogen doping concentration of $10^{17} cm^{-3}$. A saturation start point S at this time is defined by an intersection point of both tangents a and b of the solid curve I. As shown in FIG. 3, an region A is a saturated region ($[N]>7\times10^{17} cm^{-3}$) and a region B is a non-saturated region ($[N]\leq 7\times10^{17} cm^{-3}$).

The interstitial nitrogen concentration is increased as the nitrogen doping concentration [N] is increased.

In order to suppress the point defects introduced by the interstitial nitrogen $N_{int}$, it is desirable to suppress the interstitial nitrogen concentration to $2\times10^{17} cm^{-3}$ or smaller, though it is a rough standard, preferably $1\times10^{17} cm^{-3}$ or smaller. If the interstitial nitrogen concentration exceeds $2\times10^{17} cm^{-3}$, then the interstitial nitrogen is diffused intensively. Study of FIG. 3 reveals that it is possible to set the interstitial nitrogen concentration to $2\times10^{17} cm^{-3}$ or smaller by setting the nitrogen doping concentration [N] to $7\times10^{17} cm^{-3}$ or smaller and to set the interstitial nitrogen concentration to $1\times10^{17} cm^{-3}$ or smaller by setting the nitrogen doping concentration [N] to $5\times10^{17} cm^{-3}$ or smaller.

Figure 4:
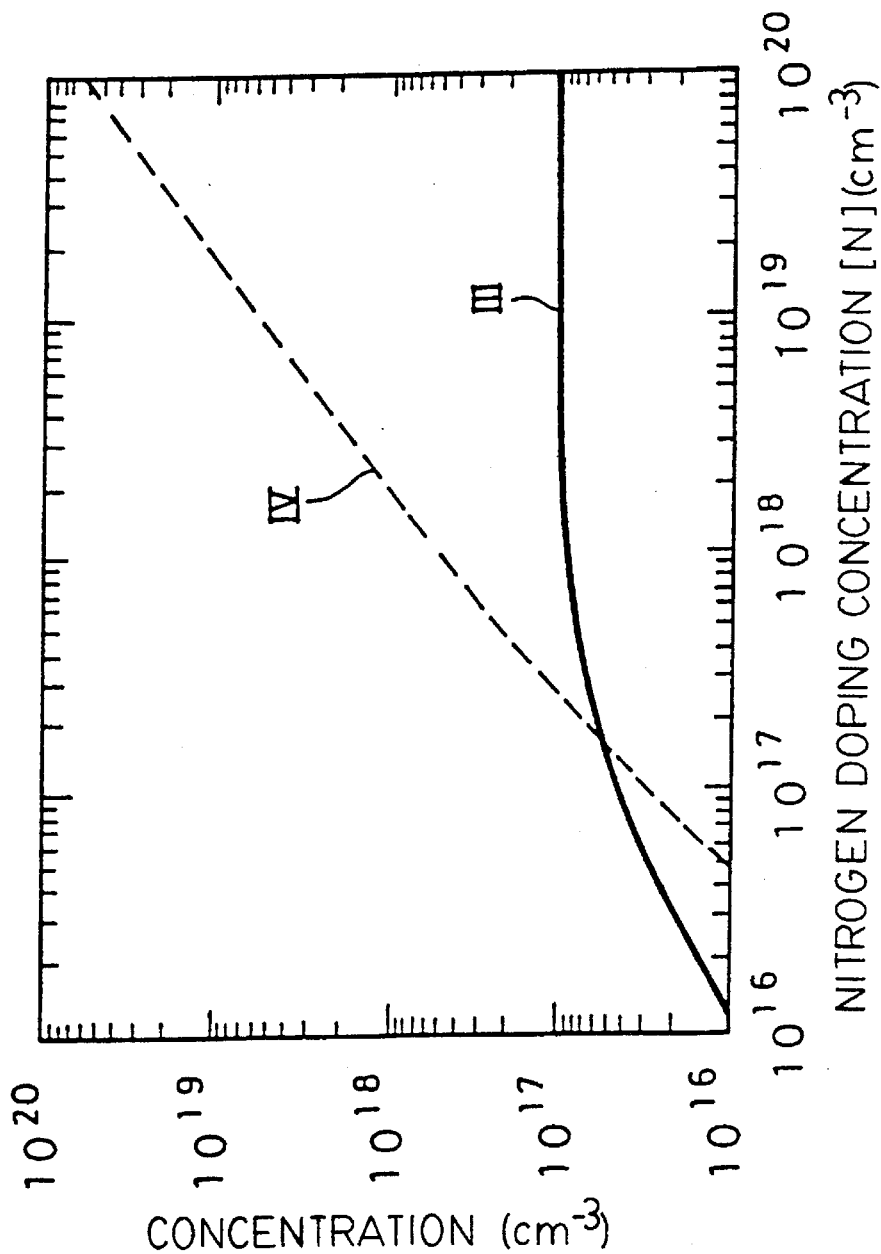
FIG. 4 is a graph showing an acceptor concentration and an interstitial nitrogen concentration relative to a nitrogen doping concentration measured when nitrogen is doped in ZnMgSSe with a band gap energy of 2.90 eV at room temperature.

ZnMgSSe becomes saturated at lower acceptor concentration as its band gap energy becomes large. FIG. 4 shows an acceptor concentration ($N_A-N_D$) and an interstitial nitrogen concentration relative to nitrogen doping concentration measured when nitrogen was doped in ZnMgSSe with a band gap energy of 2.90 eV at room temperature. In FIG. 4, a solid curve III represents the acceptor concentration and a broken curve IV represent the interstitial nitrogen concentration.

Study of FIG. 4 shows that it is possible to set the interstitial nitrogen concentration to $1.4\times10^{17} cm^{-3}$ or smaller by setting the nitrogen doping concentration [N] to $3\times10^{17} cm^{-3}$ or smaller.

Figure 5:
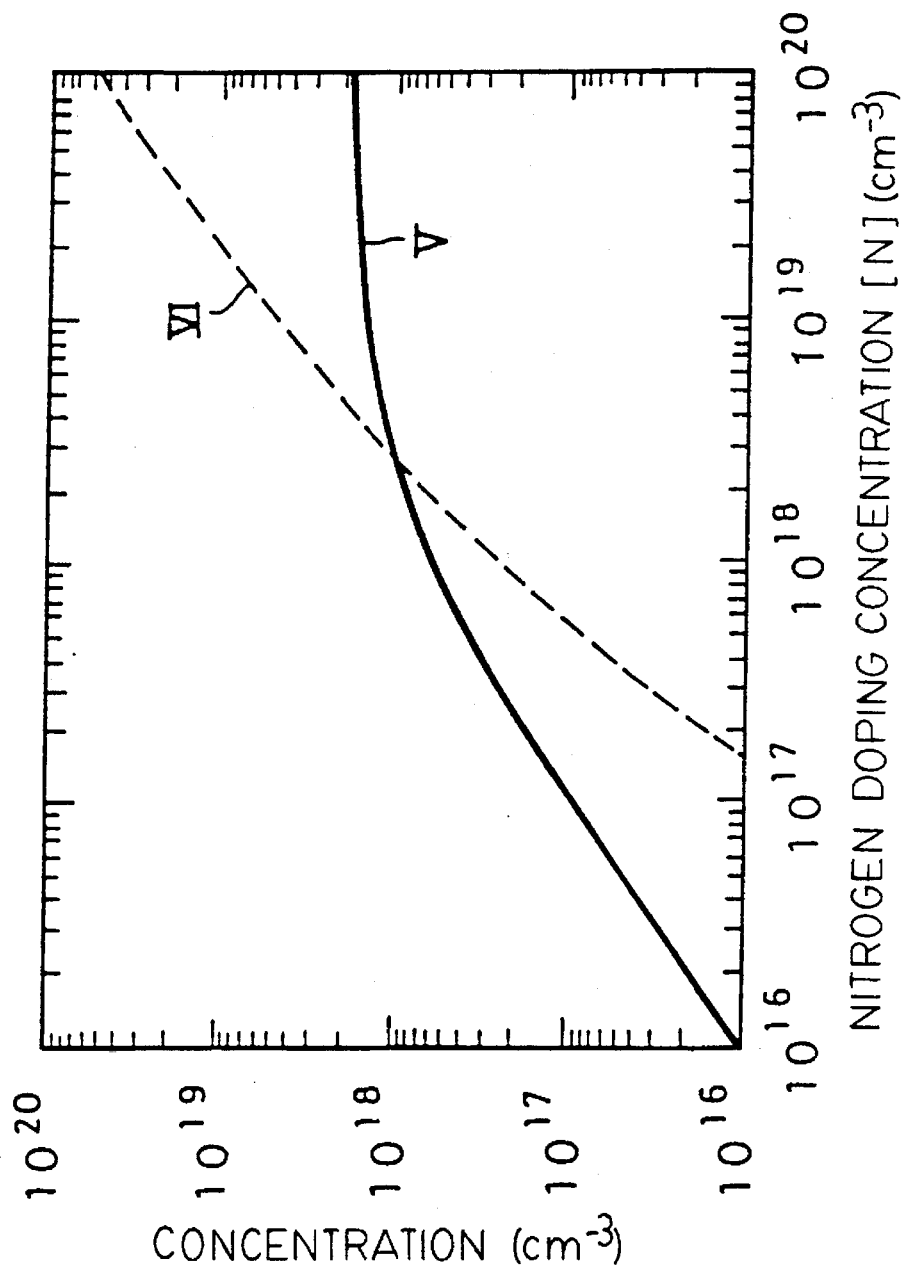
FIG. 5 is a graph showing an acceptor concentration and an interstitial nitrogen concentration relative to a nitrogen doping concentration measured when nitrogen is doped in ZnSe at room temperature.

FIG. 5 shows an activated-acceptor concentration ($N_A-N_D$) and an interstitial nitrogen concentration relative to nitrogen doping concentration measured when nitrogen N, the p-type impurity, was doped in ZnSe forming the guide layers. In FIG. 5, a solid curve V represents the acceptor concentration and a broken curve VI represent the interstitial nitrogen concentration. Study of FIG. 5 shows that it is possible to set the interstitial nitrogen concentration to $2\times10^{17} cm^{-3}$ or smaller by setting the nitrogen doping concentration [N] to $8\times10^{17} cm^{-3}$ or smaller and to set the interstitial nitrogen concentration to $1\times10^{17} cm^{-3}$ or smaller by setting the nitrogen doping concentration [N] to $6\times10^{17} cm^{-3}$ or smaller. In case of ZnSSe obtained by including S of about 6% in ZnSe, its concentration distribution is substantially similar to that of ZnSe.

However, in the first embodiment shown in FIG. 2, the second cladding layer 6 has a portion 23 in contact with the second guide layer 5 and a main portion 24 other than the portion 23. The main portion 24 is formed as the high impurity-doped region with a nitrogen doping concentration [N] of $[N]>7\times10^{17} cm^{-3}$ such that the acceptor concentration is set in the saturated region A on the basis of the concentration distribution graph shown in FIG. 3 for suppressing the increase of a total resistance. The second cladding layer 6 has the portion 23 in contact with the second guide layer 5 is formed as the lightly impurity-doped region with the nitrogen doping concentration of $[N]\leq 5\times10^{17} cm^{-3}$, preferably $[N]\leq 1\times10^{17} cm^{-3}$.

In case of $[N] 5\times10^{17} cm^{-3}$, the acceptor concentration becomes $3\times10^{17} cm^{-3}$ or smaller and the concentration of the interstitial nitrogen $N_{int}$ becomes $1\times10^{17} cm^{-3}$ or smaller. Therefore, the interstitial nitrogen $N_{int}$ is reduced and the diffusion of the interstitial nitrogen $N_{int}$ is suppressed. If the interstitial nitrogen concentration has the above value, it is possible to suppress a harmful influence resulting from point defects.

In case of $[N]\leq 1\times10^{17} cm^{-3}$, the acceptor concentration becomes $8\times10^{16} cm^{-3}$ or smaller and the concentration of the interstitial nitrogen $N_{int}$ becomes $1\times10^{16} cm^{-3}$ or smaller. If the interstitial nitrogen concentration has the above value, the point defects is substantially negligible.

Moreover, the second guide layer 5 shown in FIG. 2 has a portion 22 in contact with the p-type second cladding layer 6 and a portion 21 in contact with the active layer 4. On the basis of the concentration distribution graph shown in FIG. 5, the portion 22 is formed as the lightly impurity-doped region with a nitrogen doping concentration [N] of $[N]\leq 2\times10^{17} cm^{-3}$ and the portion 21 is formed as the non-doped region. When the nitrogen doping concentration [N] of the second guide layer 5 made of Zn(S)Se is set as $[N]\leq 2\times10^{17} cm^{-3}$, the interstitial nitrogen concentration is $1\times10^{16} cm^{-3}$ or smaller. Specifically, the II/VI-compound semiconductor light emitting device 25 according to the first embodiment shown in FIG. 2 has a multistage doping concentration distribution in which the nitrogen doping concentration in the region of the second cladding layer 6 and the second guide layer 5 becomes lowered stepwise toward the active layer 4.

According to the II/VI-compound semiconductor laser 25 having the above-mentioned arrangement shown in FIG. 2, since the II/VI-compound semiconductor laser 25 has the multistage impurity doping concentration distribution in the region from the p-type second cladding layer 6 to the p-type second guide layer 5 and particularly the portion 23, which is in contact with the second guide layer 5, of the second cladding layer 6 is formed as the lightly impurity-doped region with $[N]\leq 5\times10^{17} cm^{-3}$, it is possible to reduce the interstitial nitrogen concentration at the portion adjacent to the active layer 4 and to suppress the point defects (nonradiative recombination factor) introduced by interstitial nitrogen near the active layer 4.

Specifically, as described above, if the interstitial nitrogen concentration in the lightly impurity-doped region 23 of the second cladding layer 6 is $1\times10^{17}\text{cm}^{-3}$ or smaller, then it is possible to suppress the harmful influence of the point defects resulting from the interstitial nitrogen $N_{int}$. If the interstitial nitrogen concentration in the lightly impurity-doped region 23 of the second cladding layer 6 is $1\times10^{16}\text{cm}^{-3}$ or smaller, then it is possible to substantially disregard the point defects resulting from the interstitial nitrogen $N_{int}$. Since the second cladding layer 6 side portion 22 of the second guide layer 5 has the nitrogen doping concentration [N] of $2\times10^{17}\text{cm}^{-3}$ or smaller, its interstitial nitrogen concentration becomes $1\times10^{16}\text{cm}^{-3}$ or smaller. Since the active layer 4 side portion 21 of the second guide layer 5 is the non-doped region, the portion 21 has no interstitial nitrogen. Accordingly, it is possible to disregard the harmful influence of the point defects in the second guide layer 5.

On the other hand, since the main portion 24 of the second cladding layer 6 is the heavily impurity-doped region with a nitrogen doping concentration [N] of $[N]>7\times10^{17}\text{cm}^{-3}$, it is possible to lower the resistance thereof.

Accordingly, it is possible to extend a lifetime of the semiconductor laser 25 by providing the lightly impurity-doped regions 22, 23 and the non-doped region 21 while the increase of a total voltage, i.e., an operating voltage of the semiconductor laser is suppressed by providing the heavily impurity-doped region 21. Thus, it becomes more practical to use the II/VI-compound semiconductor laser, i.e., the green or blue semiconductor laser.

Figure 6:
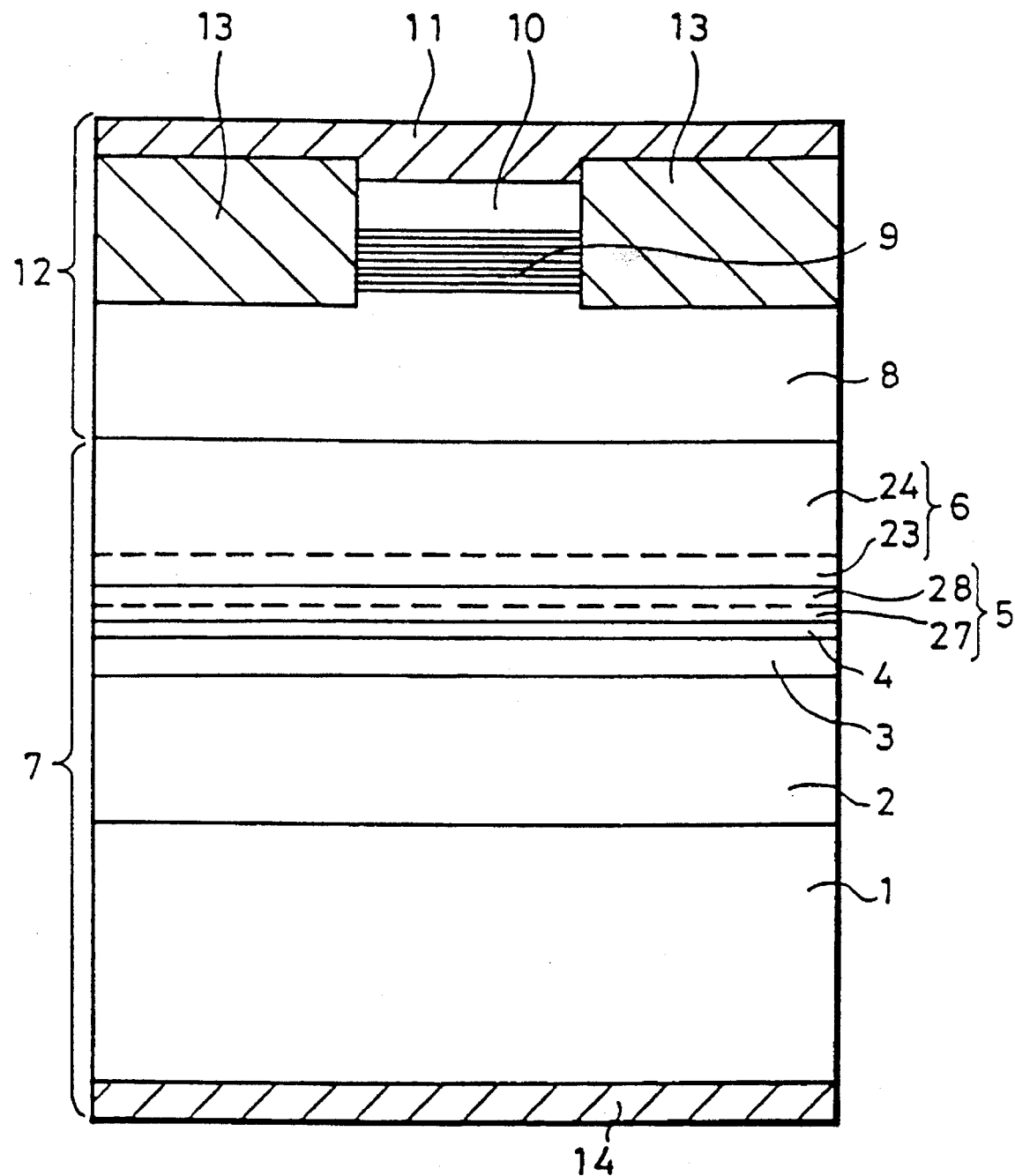
FIG. 6 is a diagram showing an arrangement of a II/VI-compound semiconductor light emitting device according to a second embodiment of the present invention.

FIG. 6 shows a second embodiment according to the present invention.

In the second embodiment, particularly a second guide layer 5 is formed as a p-type guide layer. The second guide layer 5 has a second cladding layer 6 side portion 28 doped with nitrogen at a concentration at which its interstitial nitrogen concentration is $5\times10^{16}\text{cm}^{-3}$ or smaller. The second guide layer 5 has a portion 28 formed in contact with the active layer 4 such that a nitrogen doping amount of the portion 28 is lower than that of the portion 27.

Other elements and parts are similar to those of the first embodiment shown in FIG. 2. Therefore, they are marked with the same references and need not be described in detail.

Figure 7:
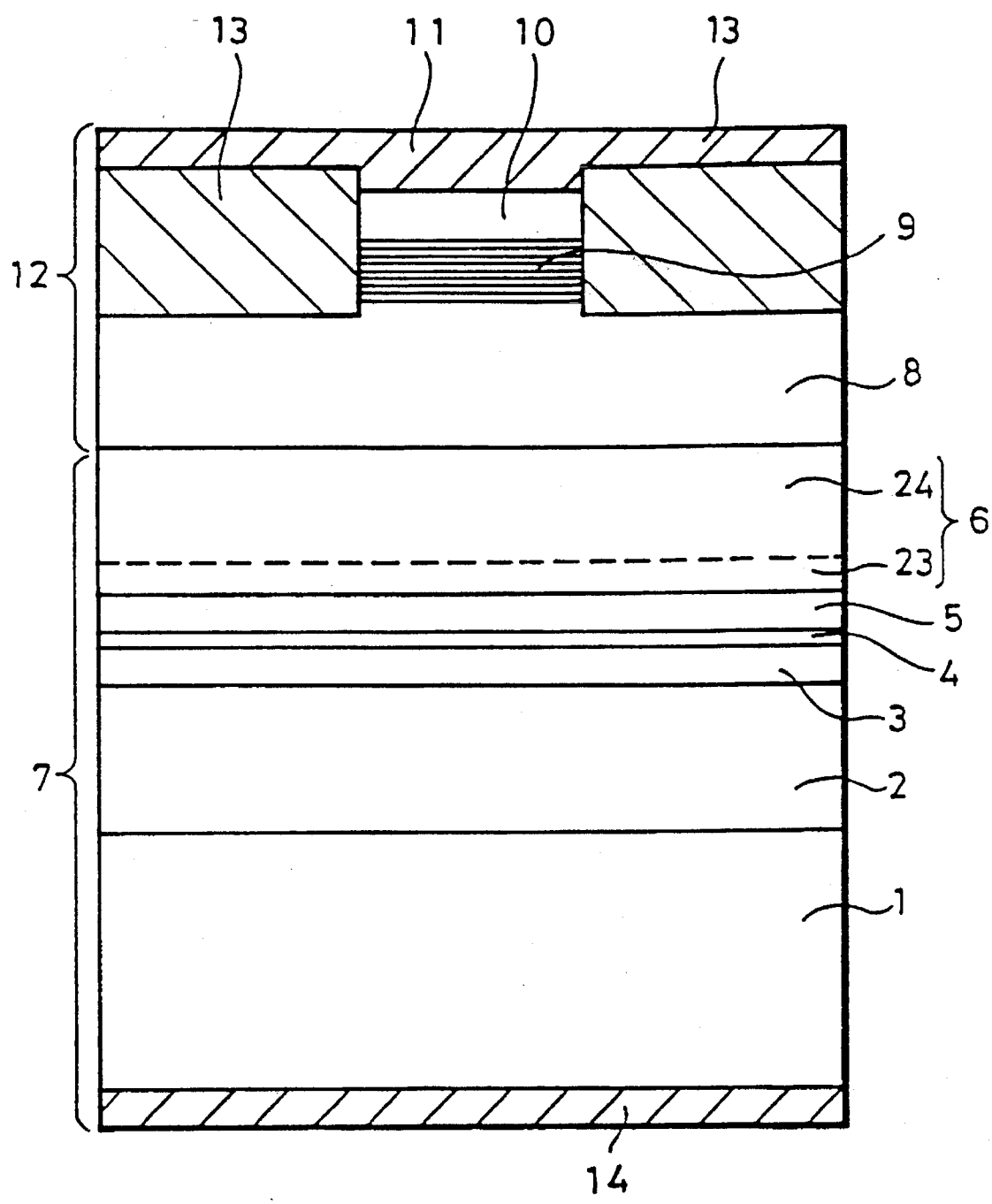
FIG. 7 is a diagram showing an arrangement of a II/VI-compound semiconductor light emitting device according to a third embodiment of the present invention.

In a II/VI-compound semiconductor laser 29 having such arrangement shown in FIG. 6, since the interstitial nitrogen $N_{int}$ at a portion adjacent to an active layer 4 is small in number, it is possible similarly to the first embodiment to suppress the point defects introduced by the interstitial nitrogen while the increase of the operating voltage is suppressed and to thereby extend the lifetime of the semiconductor laser. FIG. 7 shows a third embodiment according to the present invention.

In the third embodiment, a second guide layer 5 is formed as a non-doped region or a p-type region with an interstitial nitrogen concentration of $5\times10^{16}\text{cm}^{-3}$ or smaller. A p-type second cladding layer 6 has a portion 23 in contact with the second guide layer 5 formed as a lightly impurity-doped region with a nitrogen doping concentration [N] of $[N]\leq 5\times10^{17}\text{cm}^{-3}$, preferably $[N]\leq 1\times10^{17}\text{cm}^{-3}$. The second cladding layer 6 has a rest portion 24 formed as a heavily impurity-doped region with a nitrogen doping concentration of $7\times10^{17}\text{cm}^{-3}$ or larger similarly to the first embodiment. Other elements and parts are similar to those of the first embodiment shown in FIG. 2. Therefore, they are marked with the same references and need not be described in detail. In a II/VI-compound semiconductor laser 31 having such arrangement shown in FIG. 7, it is possible to suppress the point defects introduced by the interstitial nitrogen while the increase of an operating voltage is suppressed and to thereby extend a lifetime of the semiconductor laser.

Figure 8:
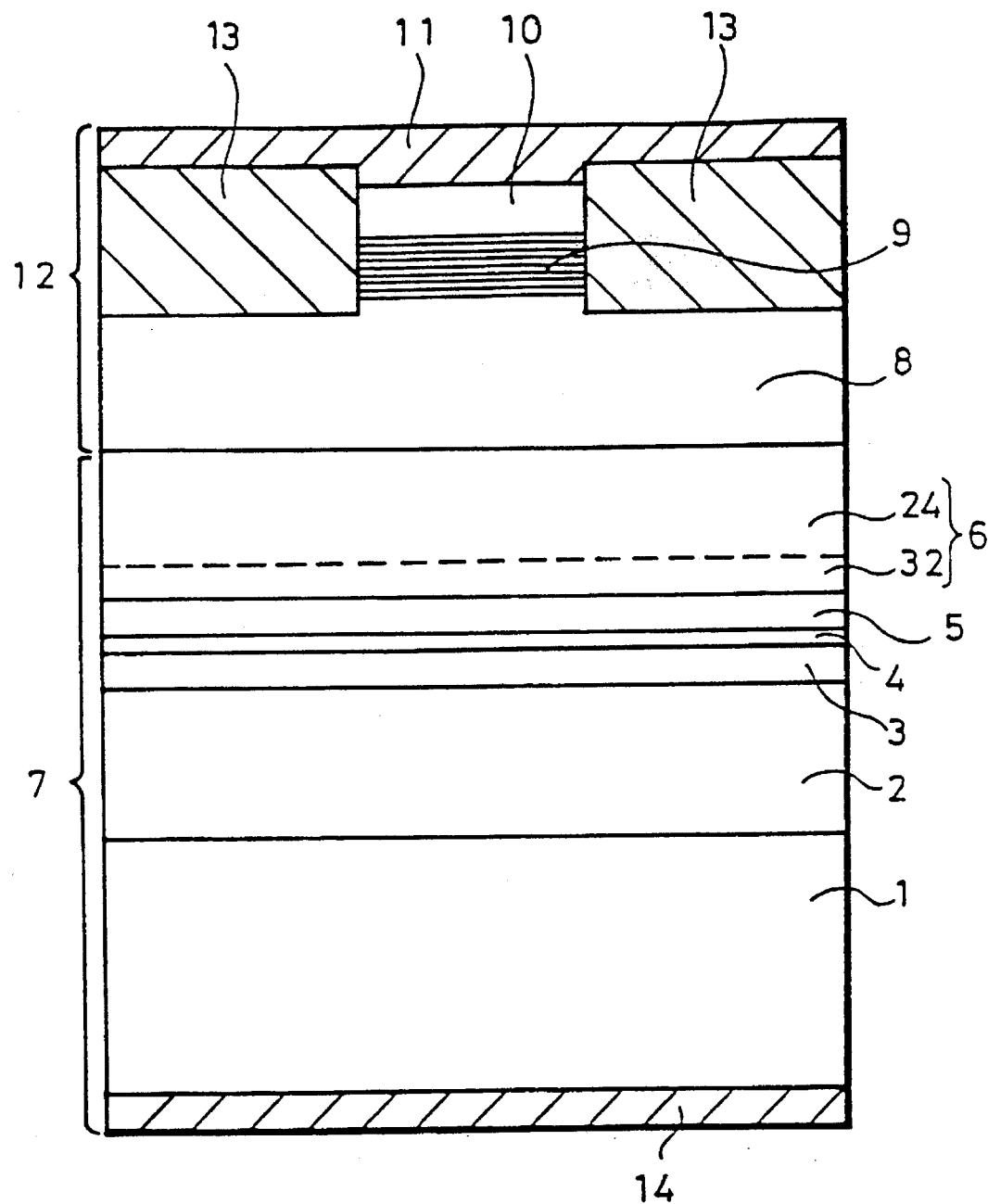
FIG. 8 is a diagram showing an arrangement of a II/VI-compound semiconductor light emitting device according to a fourth embodiment of the present invention.

FIG. 8 shows a fourth embodiment according to the present invention.

In the fourth embodiment, a second guide layer 5 is formed as a non-doped region or a p-type region with an interstitial nitrogen concentration of $5\times10^{16}\text{cm}^{-3}$ or smaller. A p-type second cladding layer 6 has a portion 32 in contact with the second guide layer 5 formed as a non-doped region.

The second cladding layer 6 has a main portion 24 other than the portion 32 in contact with the second guide layer 5, the main portion 24 being formed as a heavily impurity-doped region with an interstitial nitrogen concentration of $7\times10^{17}\text{cm}^{-3}$ or larger similarly to the first embodiment.

Other elements and parts are similar to those of the first embodiment shown in FIG. 2. Therefore, they are marked with the same references and need not be described in detail.

In a II/VI-compound semiconductor laser 33 having such arrangement shown in FIG. 8, it is possible to suppress the interstitial nitrogen introduced near the active layer by forming the portion 32, which is in contact with the second guide layer 5, of the second cladding layer 6 as the non-doped region. It is possible to suppress the point defects introduced by the interstitial nitrogen while the increase of an operating voltage is suppressed and to extend the lifetime of the semiconductor laser.

Figure 9:
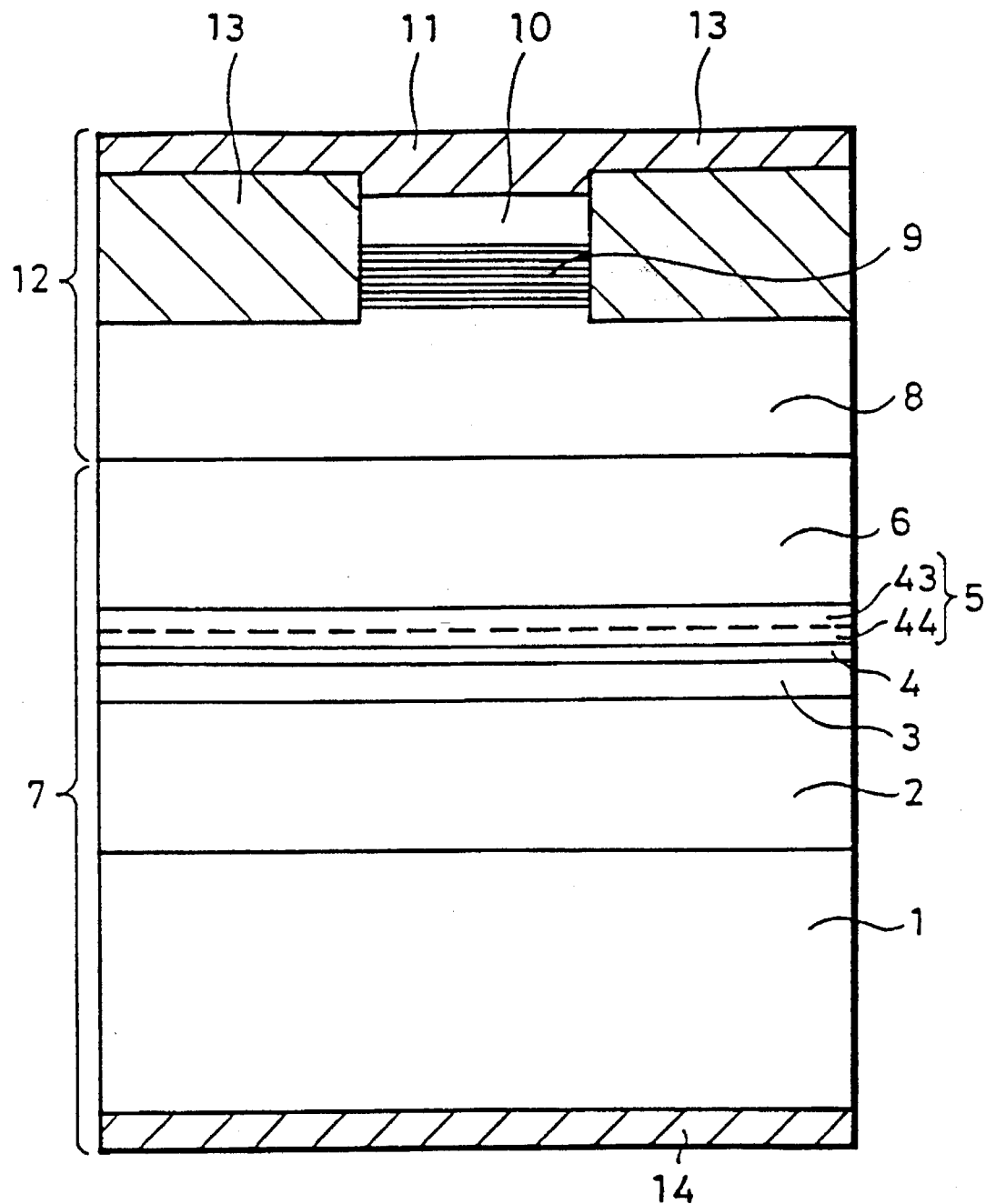
FIG. 9 is a diagram showing an arrangement of a II/VI-compound semiconductor light emitting device according to a fifth embodiment of the present invention.

FIG. 9 shows a fifth embodiment according to the present invention.

In the fifth embodiment, a second cladding layer 6 is formed as a p-type region with a normal impurity concentration. A second guide layer 5 has a second cladding layer 6 side portion 43 formed as a p-type region with a normal impurity concentration. The second guide layer 5 has a portion 44 in contact with an active layer 4 formed as a non-doped region or a lightly impurity-doped region as described above.

Other elements and parts are similar to those of the first embodiment shown in FIG. 2. Therefore, they are marked with the same references and need not be described in detail.

In a II/VI-compound semiconductor laser 45 having such arrangement shown in FIG. 9, it is possible to suppress the interstitial nitrogen introduced near the active layer by forming the portion 44, which is in contact with the active layer 4, of the second guide layer 5 as the non-doped region or the lightly impurity-doped region. It is possible to suppress the point defects introduced by the interstitial nitrogen while increase of an operating voltage is suppressed and to extend the lifetime of the semiconductor laser.

Figure 10:
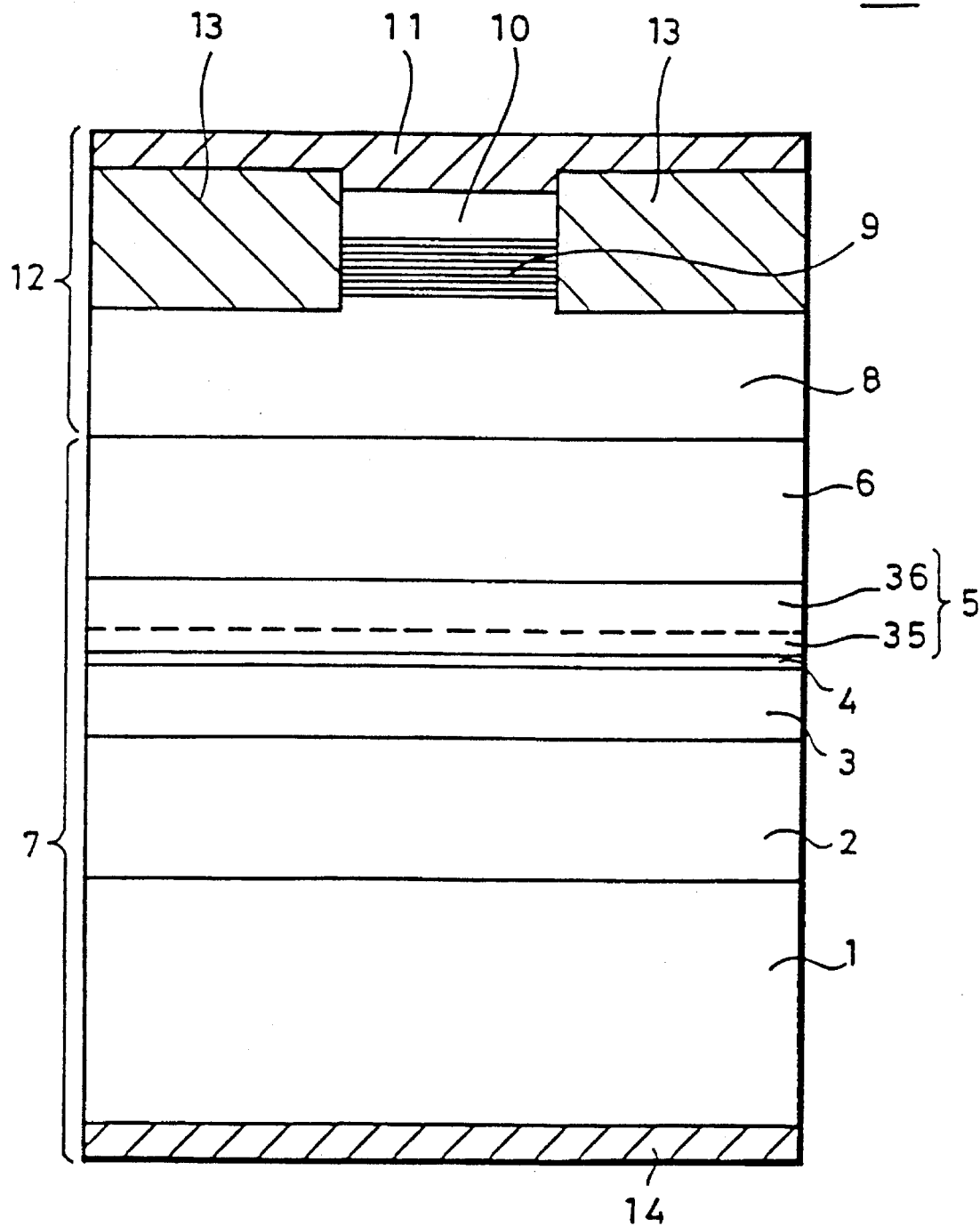
FIG. 10 is a diagram showing an arrangement of a II/VI-compound semiconductor light emitting device according to a sixth embodiment of the present invention.

In each of the first to ninth embodiments respectively shown in FIGS. 2 and 6 through 9, the present invention is applied to a semiconductor laser having a so-called separate confinement heterostructure (SCH) in which an active layer is sandwiched by guide layers and cladding layers are disposed outside the guide layers, particularly the SCH having a guide layer with small thickness of about 900 Å to 1200 Å. FIG. 10 shows a sixth embodiment in which the present invention is applied to an SCH having a guide layer with large thickness of 1500Å or 2000Å or larger, for example.

In the sixth embodiment shown in FIG. 10, a second guide layer 5 has a portion 35 in contact with an active layer 4 and a portion 36 which is a region except the portion 35. The portion 35 is formed as a non-doped region or a lightly impurity-doped region with a nitrogen doping concentration [N] of $8\times10^{17}\text{cm}^{-3}$ or smaller, for example, preferably $6\times10^{17}cm^{-3}$ or smaller which is smaller than a nitrogen doping concentration of the portion 36. A p-type second cladding layer 6 is formed as a heavily impurity-doped region in which an acceptor concentration is set in a saturated region A shown in FIG. 3.

Other elements and parts are similar to those of the first embodiment shown in FIG. 2. Therefore, they are marked with the same references and need not be described in detail.

It is possible to set a nitrogen doping concentration in a region from the portion 36 to the portion 35 to $8\times10^{17}cm^{-3}$ or smaller to reduce the nitrogen doping concentration stepwise toward the active layer 4.

In a II/VI-compound semiconductor laser 37 having such arrangement shown in FIG. 10, since the second guide layer 5 has a stepwise distribution of the nitrogen doping concentration in which the second guide layer 5 has low nitrogen doping concentration on its active layer 4 side, it is possible to suppress the point defects introduced by the interstitial nitrogen and to thereby extend the lifetime of the semiconductor laser.

Figure 11:
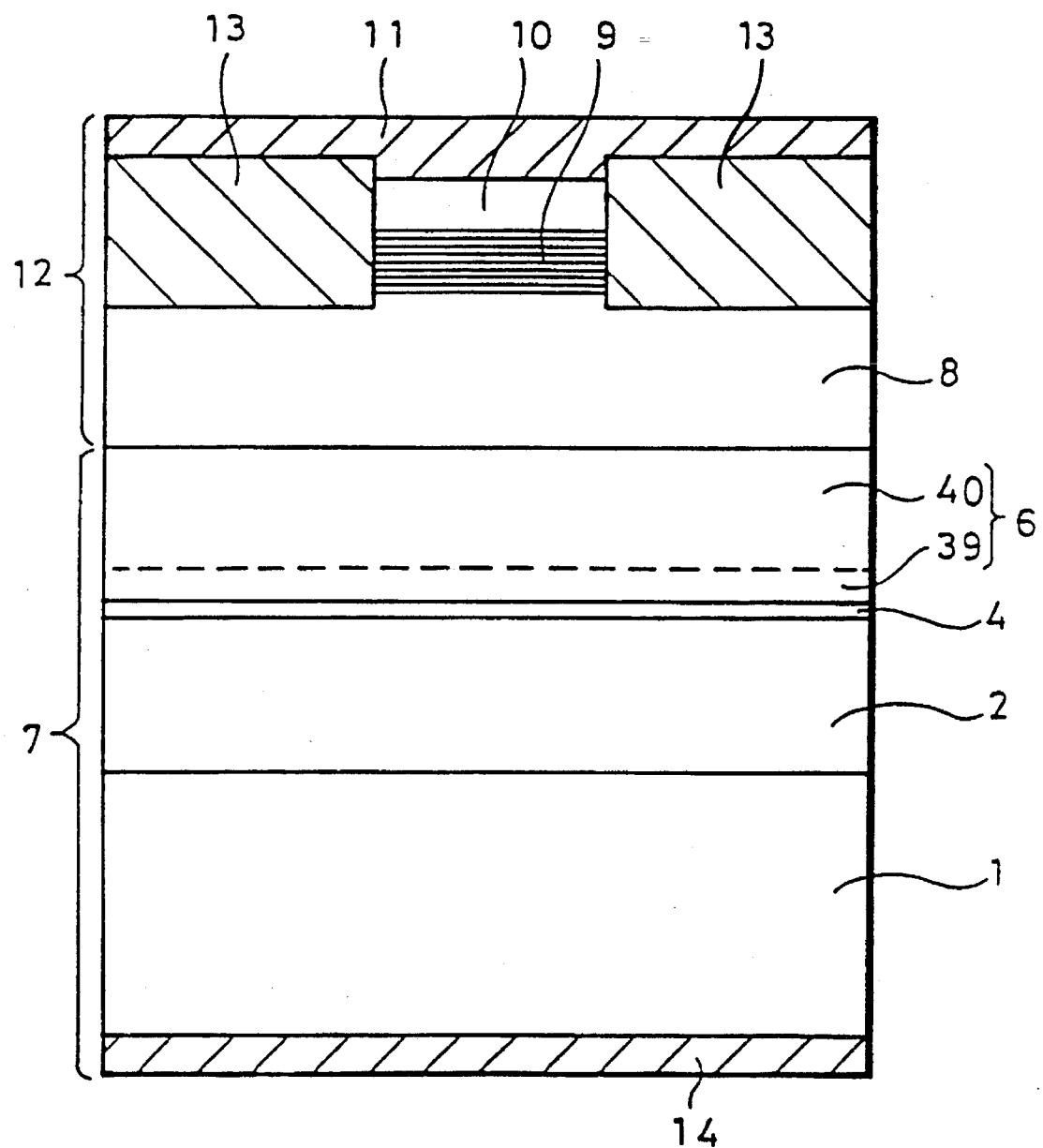
FIG. 11 is a diagram showing an arrangement of a II/VI-compound semiconductor light emitting device according to a seventh embodiment of the present invention.

FIG. 11 shows a seventh embodiment according to the present invention.

In the seventh embodiment, the present invention is applied to a II/VI-compound semiconductor laser having a so-called double heterostructure (DH) in which an active layer is directly sandwiched by cladding layers.

In the seventh embodiment, as shown in FIG. 10, a II/VI-compound semiconductor laser 41 has a substrate 1 made of an n-type single crystal GaAs doped with Si, for example, a first cladding layer 2 made of n-ZnMgSSe doped with Cl, for example, an active layer 4 made of ZnCdSe, and a second cladding layer 6 made of p-ZnMgSSe doped with N. The first cladding layer 2, the active layer 4 and the second cladding layer 6 are formed on the surface of the substrate 1 by epitaxial growth to form a semiconductor laser portion 7. In the seventh embodiment, particularly the second cladding layer 6 has a portion 39 in contact with the active layer 4 formed as the lightly impurity-doped region or the non-doped region as described with reference to FIG. 2 and a rest portion 40 other than the portion 39 formed as the heavily impurity-doped region as described with reference to FIG. 2. It is possible to form the portion 39, which is in contact with the active layer 4, of the second cladding layer 6 as the non-doped region.

Subsequently, similarly to the first embodiment shown in FIG. 2, the II/VI-compound semiconductor laser 41 has a p-side electrode portion 12 formed on the second cladding layer 6 and an electrode 14 formed on the other surface of the substrate 1.

In the II/VI-compound semiconductor laser 41 having such arrangement shown in FIG. 11, since the portion 39, which is in contact with the active layer 4, of the p-type second cladding layer 6 is formed as the lightly impurity-doped region or the non-doped region, it is possible to suppress the point defects introduced near the active region and to thereby extend the lifetime of the semiconductor laser.

Figure 12:
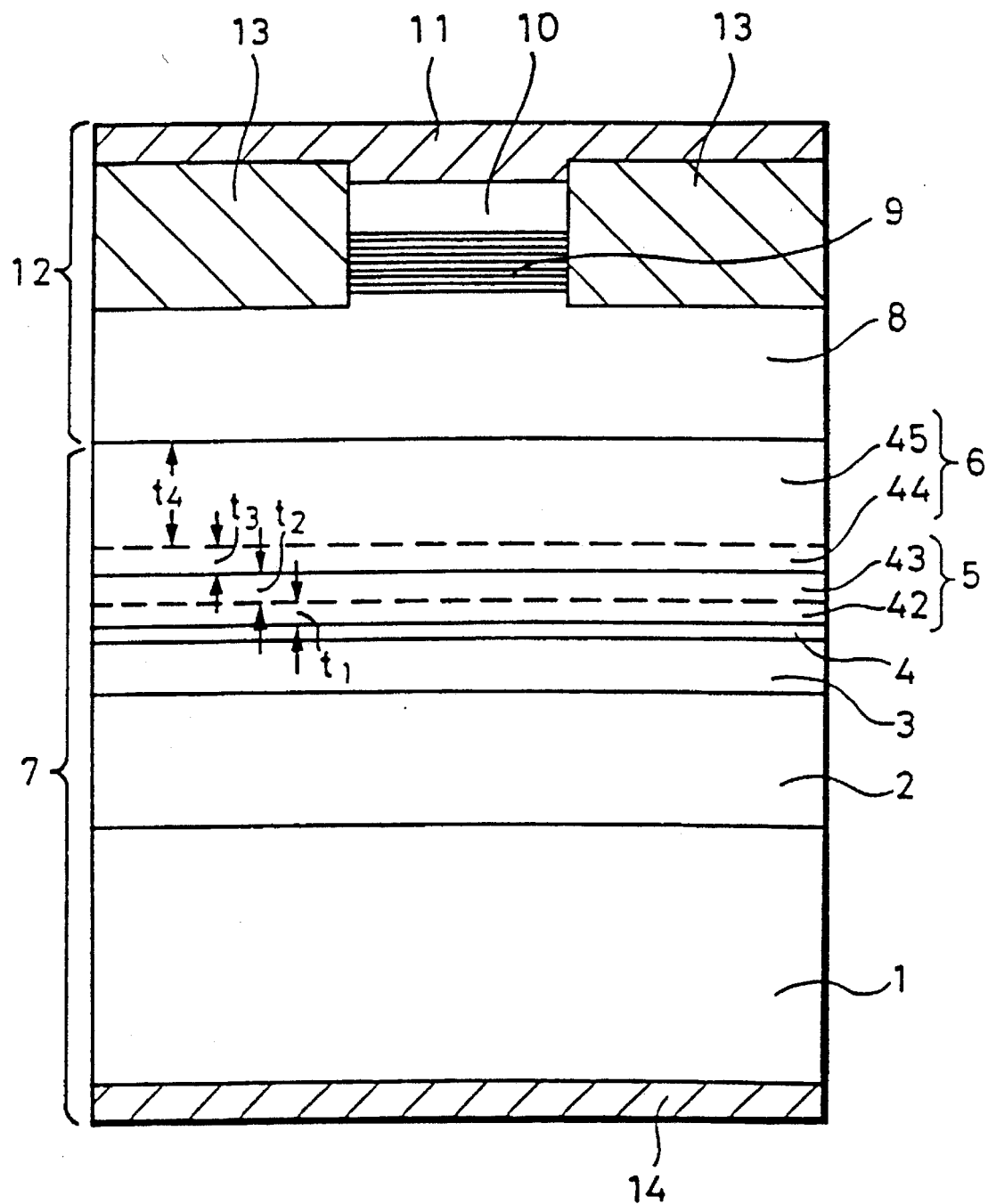
FIG. 12 is a diagram showing an arrangement of a II/VI-compound semiconductor light emitting device according to an eighth embodiment of the present invention.

FIG. 12 shows an eighth embodiment according to the present invention.

In the eighth embodiment, a second guide layer 5 has a region in contact with an active layer 4 formed as a non-doped region 42 and a rest region other than the non-doped region 42 formed as a heavily impurity-doped region 43 (a so-called p-type guide region) in which an acceptor concentration is set in the saturated region A shown in FIG. 3. A second cladding layer 6 has a region in contact with the second guide layer 5 formed as a non-doped region 44 and a rest region other than the non-doped region 44 formed as a heavily impurity-doped region 45 in which an acceptor concentration is set in the saturated region A shown in FIG. 3.

A thickness $t_1$ of the non-doped region 42 of the second guide layer 5 can be set in a range of from 300 Å to 900 Å and a thickness $t_2$ of the heavily impurity-doped region 43 can be set in a range of from 900 Å to 300 Å. A thickness $t_3$ of the non-doped region 44 of the second cladding layer 6 can be set in a range of from 50 Å to 2000 Å and a thickness $t_4$ of the heavily impurity-doped region 45 can be set in a range of from 7500Å to 5500Å.

In the eighth embodiment shown in FIG. 12, the thickness $t_1$ of the non-doped region 42 of the second guide layer 5 is set to 700 Å and the thickness $t_2$ of the heavily impurity-doped region 43 thereof is set to 500 Å. The thickness $t_3$ of the non-doped region 44 of the second cladding layer 6 is set to 500 Å and the thickness $t_4$ of the heavily impurity-doped region 45 is set to 7100 Å. A thickness of a first cladding layer 2 is set to 7600 Å and a thickness of a fist guide layer 3 is set to 1200Å. A thickness of the active layer 4 is set to 70Å and a thickness of a first semiconductor layer 8 serving as a capping layer was set to 4000 Å.

Other elements and parts are similar to those of the first embodiment shown in FIG. 2. Therefore, they are marked with the same references and need not be described in detail.

According to a II/VI-compound semiconductor laser 46 having such arrangement shown in FIG. 12, since the region, which is in contact with the active layer 4, of the second guide layer 5 is formed as the non-doped region 42 and the region, which is in contact with the second guide layer 5, of the second cladding layer 6 is formed as the non-doped region 44, it is possible to control the point defects introduced by the interstitial nitrogen and further to reduce an amount of electrons overflowing into the second cladding layer 6. Thus, it is possible to extend the lifetime of the semiconductor laser. Moreover, it is possible to lower the threshold current value Ith.

If the thickness $t_1$ of the non-doped region 42 of the second guide layer 5 is smaller than 300 Å, then it is impossible to achieve an effect of controlling the point defects. If the thickness $t_1$ exceeds 900 Å, then the amount of electrons overflowing into the second cladding layer 6 and the threshold current value Ith are both increased. If the thickness $t_3$ of the non-doped region 44 of the second cladding layer 6 is smaller than 50 Å, then it is impossible to achieve an effect of suppressing the point defects. If the thickness $t_3$ exceeds 2000 Å, then an influence occurs which is caused by the increase of a total resistance.

Figure 13:
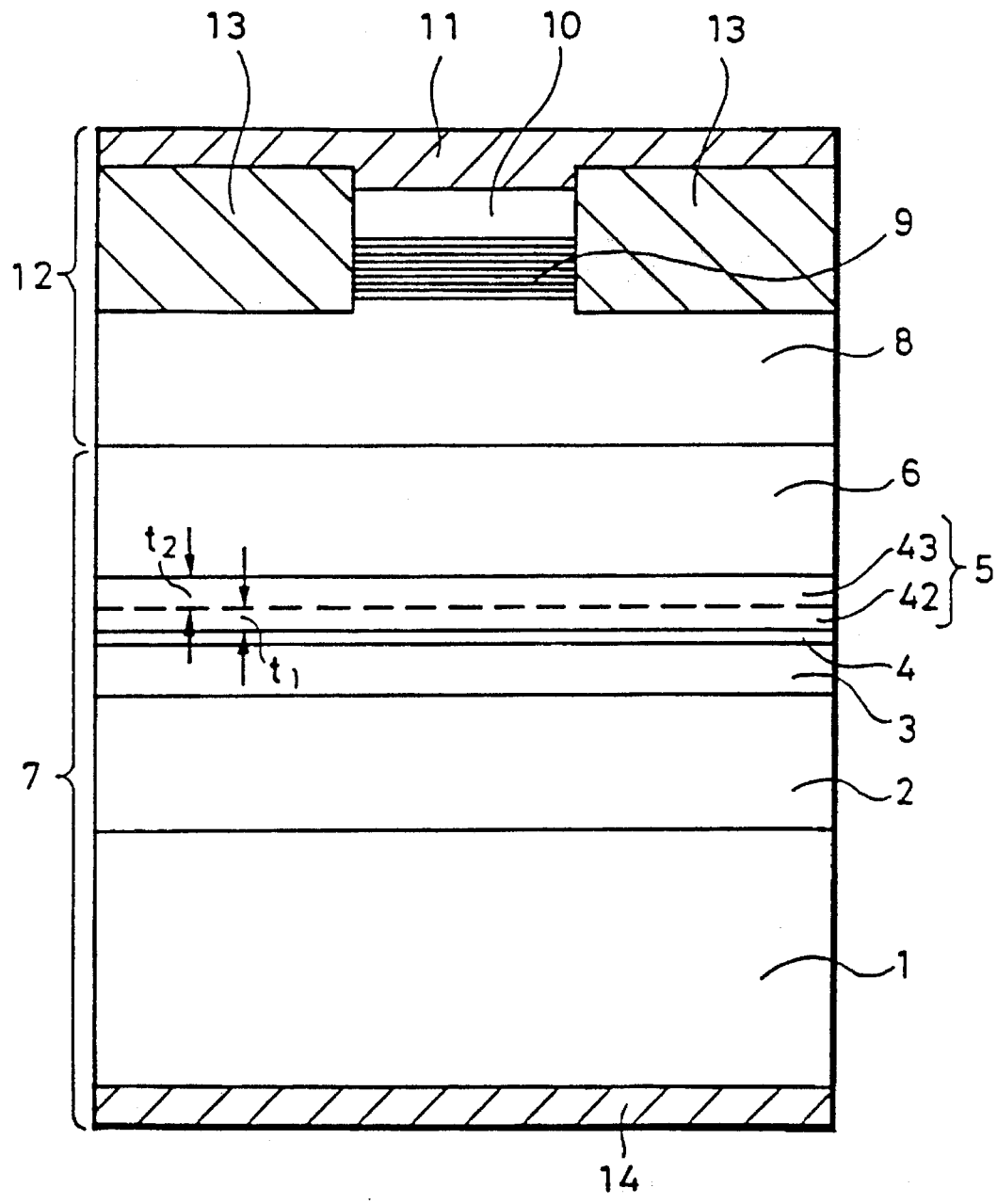
FIG. 13 is a diagram showing an arrangement of a II/VI-compound semiconductor light emitting device according to a ninth embodiment of the present invention.

FIG. 13 shows a ninth embodiment according to the present invention.

In the ninth embodiment, a second guide layer has a region in contact with an active layer 4 formed as a non-doped region 42 and a rest region other than the region 42 formed as a heavily impurity-doped region 43 in which an acceptor concentration is set in a saturated region A shown in FIG. 3. A second cladding layer 6 is formed as a heavily impurity-doped region in which an acceptor concentration is set in the saturated region A shown in FIG. 3.

A thickness $t_1$ of the non-doped region 42 of the second guide layer 5 can be set in a range of from 300 Å to 900 Å and a thickness $t_2$ of the heavily impurity-doped region 43 can be set in a range of from 900 Å to 300 Å. In the ninth embodiment shown in FIG. 13, the thickness $t_1$ is set to 700 Å and the thickness $t_2$ is set to 500 Å. A thickness of each of first and second cladding layers 2, 6 is set to 7600 Å and a thickness of a fist guide layer 3 is set to 1200 Å. A thickness of the active layer 4 is set to 70 Å and a thickness of a first semiconductor layer 8 serving as a capping layer is set to 4000 Å. Other elements and parts are similar to those of the first embodiment shown in FIG. 2. Therefore, they are marked with the same references and need not be described in detail.

In a II/VI-compound semiconductor laser 47 having such arrangement shown in FIG. 13, since the region with the thickness $t_1$, which is in contact with the active layer 4, of the second guide layer 5 is formed as the non-doped region 42, it is possible to control the point defects introduced by the interstitial nitrogen and to lower an amount of electrons overflowing into the second cladding layer 6. Thus, it is possible to extend the lifetime of the semiconductor. Moreover, it is possible to lower the threshold current value Ith.

Since the semiconductor laser 46 shown in FIG. 12 has the non-doped region 44 formed also in the second cladding layer 6, the semiconductor laser 46 achieves a greater effect of suppressing the point defects as compared with the semiconductor laser 47.

Figure 14:
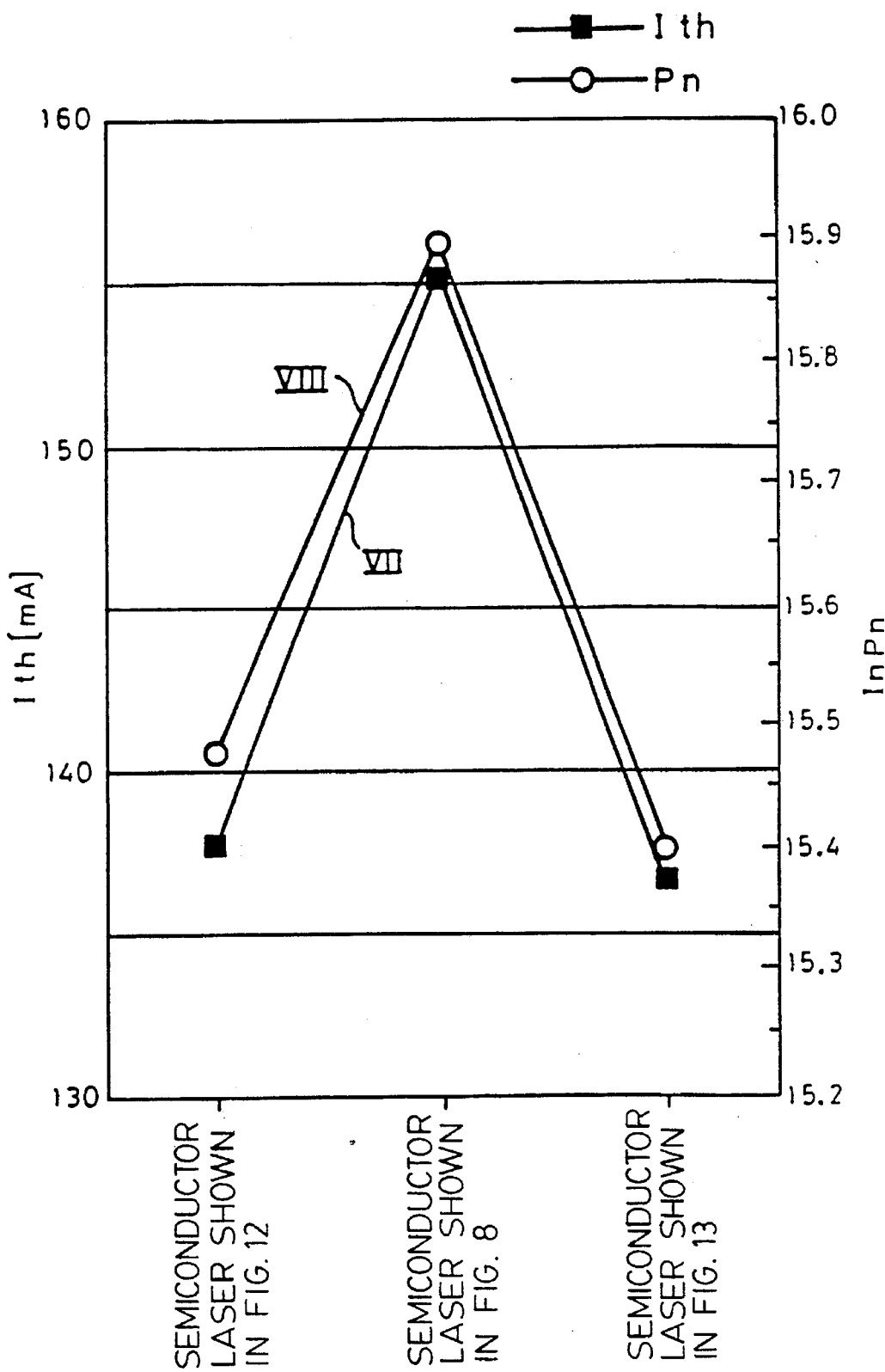
FIG. 14 is a graph showing simulated results of a threshold current value Ith and an electron overflow amount (Pn).

FIG. 14 is a graph showing simulated results of the threshold current value Ith and an amount (Pn) of electron overflowing into the second cladding layer 6 obtained when there were compared the semiconductor laser 46 having the arrangement shown in FIG. 12, the semiconductor laser 47 having the arrangement shown in FIG. 13 and the semiconductor laser 33 having the arrangement shown in FIG. 8 in which the second guide layer 5 was formed as the non-doped region and the portion 32, that was in contact with the second guide layer 5, of the second cladding layer 6 was formed as the non-doped region. In FIG. 14, a solid curve VII represents the threshold current value Ith and a solid curve VIII represents the electron overflow amount (Pn).

The semiconductor laser 33 shown in FIG. 8 used in the above comparison had the first cladding layer 2 with a thickness of 7600 Å, the first guide layer 3 with a thickness of 1200 Å, the active layer 4 with a thickness of 70 Å, the second guide layer 5 with a thickness of 1200 Å and the non-doped region 32 of the second cladding layer 6 with a thickness of 500 Å, and the heavily impurity-doped region 24 thereof with a thickness of 7100 Å.

Study of the graph shown in FIG. 14 reveals that the threshold current values Ith and electron overflow amounts (Pn) of the semiconductor lasers 46, 47 respectively shown in FIGS. 12 and 13 were lowered as compared with the semiconductor laser 33 shown in FIG. 8. Specifically, since an effective barrier to electron is lowered as thicknesses of the non-doped regions in the second cladding layer 6 and the guide layer 5 are increased, the amount of electrons overflowing into the p side of the semiconductor laser from the n side thereof is increased. Accordingly, by employing the arrangements of the II/VI-compound semiconductor lasers 46, 47 respectively shown in FIGS. 12 and 13, it is possible to further suppress the amount of electrons overflowing into the p-side cladding layer and to thereby extend the lifetime of the semiconductor laser. Moreover, it is possible to suppress the increase of the threshold current Ith. Thus, the blue semiconductor laser becomes more practical.

While N is used as the p-type impurity as described above, the present invention is not limited thereto and other group I or IV elements, such as indium In can be used with similar effects being achieved.

While ZnMgSSe is used to form the first and second cladding layers 3, 6 as described above, the present invention is not limited thereto and a superlattice structure of ZnMgSSe and ZnSe may be used. In this case, an impurity doping concentration of an active-layer side lightly impurity-doped region is selected in response to a composition of the superlattice structure such that an interstitial impurity concentration should be $2\times10^{17} cm^{-3}$ or smaller.

According to a method of controlling the above doping concentration of the p-type impurity, i.e., N stepwise, when active nitrogen excited by plasma is used, it is possible to control the nitrogen doping concentration stepwise by changing a plasma power.

Moreover, while the second cladding layer 6 and/or the active-layer side portion of the second guide layer 5 in the p-side region which is intensively influenced by the interstitial nitrogen are formed as the lightly impurity-doped region or the non-doped region as described above, it is possible that the first cladding layer 2 and/or the first guide layer 3 in the n-side region have the same arrangement.

As described above, according to the present invention, it is possible to obtain the room-temperature continuous-wave-oscillation and long-life II/VI-compound semiconductor laser, i.e., the green or blue semiconductor laser. Accordingly, it becomes much more practical to use the II/VI-compound laser in the optical pickup apparatus for high-density magneto-optical recording.

While the present invention is applied to the II/VI-compound semiconductor laser as described above, the present invention is not limited thereto and can be applied to a light emitting diode of the II/VI-compound semiconductor.

As described above, according to the present invention, since the active-layer side portion of the second cladding layer 6 is formed as the lightly impurity-doped region or the non-doped region, it is possible to suppress the point defects introduced by the interstitial nitrogen near the active layer 4 and to extend the lifetime of the II/VI-compound semiconductor light emitting device.

According to the present invention, it is possible to extend the lifetime of the II/VI-compound semiconductor light emitting devices having DH and SCH structures.

In addition, according to the present invention, since the II/VI-compound semiconductor light emitting device has the lightly impurity-doped region or the non-doped region in its portion from the second cladding layer 6 to the second guide layer 5, it is possible to further extend the lifetime of the SCH II/VI-compound semiconductor light emitting device.

Since the above SCH II/VI-compound semiconductor light emitting device having the lightly impurity-doped region further has the portion, which is in contact with the active layer 4, of the second guide layer 3 formed as the non-doped region, it is possible to suppress the point defects introduced by the interstitial nitrogen near the active layer 4 and to further extend the lifetime of the SCH II/VI-compound semiconductor light emitting device.

Moreover, since the SCH II/VI-compound semiconductor light emitting device has the lightly impurity-doped region from the second cladding layer 6 to the second guide layer 5 where the impurity doping concentration at the active-layer side portion thereof is selected to be smaller than the other portion thereof, it is possible to further suppress the influence of the point defects resulting from the interstitial impurity and to increase the lifetime of the SCH II/VI-compound semiconductor light emitting device.

Since the impurity doping concentration of the second cladding layer 6 is decreased stepwise toward the active layer 4, it is possible to suppress the influence of the point defects resulting from the interstitial impurity in the second cladding layer 6 and to increase the lifetime of the II/VI-compound semiconductor light emitting device.

Since the SCH II/VI-compound semiconductor light emitting device has the second guide layer 5 whose active-layer 4 side portion is formed as the lightly impurity-doped region or the non-doped region, it is similarly possible to increase the lifetime of the SCH II/VI-compound semiconductor light emitting device. This arrangement is also effective in the SCH II/VI-compound semiconductor light emitting device having the thick guide layers.

Since the impurity doping concentration of the lightly impurity-doped region is selected such that the interstitial impurity concentration becomes $2\times10^{17} cm^{-3}$ or smaller, it is possible to suppress the harmful influence of the point defects and to reliably increase the lifetime of the II/VI-compound semiconductor light emitting device.

Since the interstitial impurity concentration of the lightly impurity-doped region made of ZnMgSSe can be selected to be $2\times10^{17} cm^{-3}$ or smaller by setting the impurity doping concentration thereof to $7\times10^{17} cm^{-3}$ or smaller, it is possible to extend the lifetime of the II/VI-compound semiconductor light emitting device.

Since the interstitial impurity concentration of the lightly impurity-doped region made of ZnMgSSe with the band gap energy of 2.9 eV or larger can be selected to be $1.4\times10^{17} cm^{-3}$ or smaller by setting the impurity doping concentration thereof to $3\times10^{17} cm^{-3}$ or smaller, it is possible to extend the lifetime of the II/VI-compound semiconductor light emitting device.

Since the interstitial impurity concentration of the lightly impurity-doped region made of Zn(S)Se can be selected to be $2\times10^{17} cm^{-3}$ or smaller by setting the impurity doping concentration thereof to $8\times10^{17} cm^{-3}$ or smaller, it is possible to extend the lifetime of the II/VI-compound semiconductor light emitting device.

Since the second guide layer 5 has the portion in contact with the active layer 4 formed as the non-doped region and has the rest portion other than the no-doped region formed as the impurity-doped region, it is possible to remove the harmful influence of the point defects and to reduce the amount of electrons overflowing into the second cladding layer 6. Thus, it is possible to extend the lifetime of the II/VI-compound semiconductor light emitting device. Moreover, it is possible to suppress the increase of the threshold current value Ith.

Since the second guide layer 5 has the region in contact with the active layer 4 formed as the non-doped region and the second cladding layer 6 has the active-layer 4 side portion formed as the non-doped region, it is possible to further extend the lifetime of the II/VI-compound semiconductor light emitting device and to suppress the increase of the threshold current value Ith.

Thus, when the present invention is applied to the II/VI-compound semiconductor light emitting device, it becomes possible to use the II/VI-compound semiconductor light emitting device in the optical pickup device suitable for the high-density magneto-optical recording.

Having described preferred embodiments of the invention with reference to the accompanying drawings, it is to be understood that the present invention is not limited to those precise embodiments and that various changes and modifications can be effected therein by one skilled in the art without departing from the spirit or scope of the invention as defined in the appended claims.

What is claimed is:

1. A II/VI-compound semiconductor light emitting device comprising:

an active layer; and a p-side cladding layer, where an active-layer side portion of said p-side cladding layer is a lightly impurity-doped region or a non-doped region.

2. A II/VI-compound semiconductor light emitting device according to claim 1, wherein said lightly impurity-doped region or non-doped region is provided at a portion in contact with an active layer.

3. A II/VI-compound semiconductor light emitting device according to claim 1, wherein said lightly impurity-doped region or non-doped region is provided at a portion in contact with a guide layer.

4. A II/VI-compound semiconductor light emitting device according to claim 3, wherein said lightly impurity-doped region is provided in said guide layer.

5. A II/VI-compound semiconductor light emitting device according to claim 4, wherein a portion, which is in contact with an active layer, of said guide layer is a non-doped region.

6. A II/VI-compound semiconductor light emitting device according to claim 4, wherein an impurity doping concentration of said lightly impurity-doped region of said cladding layer is small as compared with that of said lightly impurity-doped region of said guide layer.

7. A II/VI-compound semiconductor light emitting device according to claim 1, wherein an impurity doping concentration of said cladding layer is decreased stepwise toward said active layer.

8. A II/VI-compound semiconductor light emitting device according to claim 1, wherein said lightly impurity-doped region has an interstitial impurity concentration of $2\times10^{17} cm^{-3}$ or smaller.

9. A II/VI-compound semiconductor light emitting device according to claim 1, wherein when said lightly impurity-doped region is made of ZnMgSSe, an impurity doping concentration of said lightly impurity-doped region is $7\times10^{17} cm^{-3}$ or smaller.

10. A II/VI-compound semiconductor light emitting device according to claim 9, wherein when said lightly impurity-doped region is made of ZnMgSSe with a band gap energy of 2.9 eV or larger, an impurity doping concentration of said lightly impurity-doped region is $3\times10^{17} cm^{-3}$ or smaller.

11. A II/VI-compound semiconductor light emitting device according to claim 1, wherein when said lightly impurity-doped region is made of Zn(S)Se, an impurity doping concentration of said lightly impurity-doped region is $8\times10^{17} cm^{-3}$ or smaller.

12. A II/VI-compound semiconductor light emitting device comprising:

an active layer; and a guide layer, wherein an active-layer side portion of said guide layer is a lightly impurity-doped region or a non-doped region.

13. A II/VI-compound semiconductor light emitting device comprising:

an active layer; and a p-side guide layer, wherein a portion, which is in contact with said active layer, of said p-side layer is a non-doped region and a region thereof other than said non-doped region is a doped region.

14. A II/VI-compound semiconductor light emitting device according to claim 13, wherein an active-layer side portion of said second guide layer is a non-doped region.

* * * * *